(12) United States Patent
Boxley, Jr. et al.

(10) Patent No.: US 8,806,319 B1
(45) Date of Patent: Aug. 12, 2014

(54) METHOD AND APPARATUS FOR LINKING NON-GEOMETRIC DATA TO GEOMETRIC ELEMENTS OF A CAD FILE INDEPENDENT OF THE PROPRIETARY CAD FILE FORMAT

(75) Inventors: Don Boxley, Jr., Fort Collins, CO (US); Peter H. Ernst, Sindelfingen (DE)

(73) Assignee: PTC Inc., Needham, MA (US)

( * ) Notice: Subject to any disclaimer, the term of this patent is extended or adjusted under 35 U.S.C. 154(b) by 1826 days.

(21) Appl. No.: 09/547,526

(22) Filed: Apr. 12, 2000

(51) Int. Cl.
   *G06F 3/00* (2006.01)

(52) U.S. Cl.
   USPC ...................................................... 715/200

(58) Field of Classification Search
   USPC .............. 715/501.1, 526, 513, 517, 523, 530, 715/200, 205, 206, 207, 208, 234; 707/100, 707/102; 700/182; 709/217
   See application file for complete search history.

(56) References Cited

U.S. PATENT DOCUMENTS

| | | | | |
|---|---|---|---|---|
| 5,117,351 A * | 5/1992 | Miller | ............................. | 707/10 |
| 5,278,751 A * | 1/1994 | Adiano et al. | .................. | 705/10 |
| 5,426,722 A * | 6/1995 | Batchelder | .................... | 700/245 |
| 5,553,224 A * | 9/1996 | Saund et al. | .................. | 345/619 |
| 5,651,012 A * | 7/1997 | Jones, Jr. | ....................... | 714/724 |
| 5,794,257 A * | 8/1998 | Liu et al. | .................... | 715/501.1 |
| 5,864,338 A * | 1/1999 | Nestor et al. | ............... | 715/500.1 |
| 5,901,068 A * | 5/1999 | Batchilo et al. | .................. | 703/6 |
| 6,035,301 A * | 3/2000 | Siegel et al. | .................. | 707/102 |
| 6,125,304 A * | 9/2000 | Suzuki | ........................... | 700/182 |
| 6,154,738 A * | 11/2000 | Call | .................................... | 707/4 |
| 6,157,947 A * | 12/2000 | Watanabe et al. | ............. | 709/217 |
| 6,199,334 B1 * | 3/2001 | Malloy | ....................... | 52/309.17 |
| 6,317,128 B1 * | 11/2001 | Harrison et al. | ............... | 345/629 |
| 6,332,150 B1 * | 12/2001 | Khan et al. | ..................... | 715/526 |
| 6,393,425 B1 * | 5/2002 | Kelly | .................................... | 1/1 |
| 6,539,387 B1 * | 3/2003 | Oren et al. | .................... | 707/100 |
| 6,954,895 B1 * | 10/2005 | Oak | .............................. | 715/502 |

OTHER PUBLICATIONS

Cohn, David S. AutoCAD14: The Complete Reference, 1999, McGraw-Hill/Osborne. Chapter 9 and Chapter 11.*

SYSTRAN, "Standard for the exchange of product model data", Feb. 22, 1995, (http://foldoc.hld.c64.org/foldoc.cgi?Standard+for+the+exchange+of+ product+model+data, Feb. 22, 1995).*

* cited by examiner

*Primary Examiner* — Kyle Stork

(74) *Attorney, Agent, or Firm* — Nelson Mullins Riley & Scarborough LLP

(57) ABSTRACT

Methods and systems link non-geometric data to the geometric elements in a CAD file. The methods and systems are independent of any CAD system and allows the user to add, edit, view, query and report on non-geometric data associated with geometric data. The methods and systems support "content rich" non-geometric data and allow this data to be 'attached' to any level of the geometric CAD data. The methods and systems are easily accessible outside of a CAD system and leverage existing standards for Internet commerce.

12 Claims, 1 Drawing Sheet

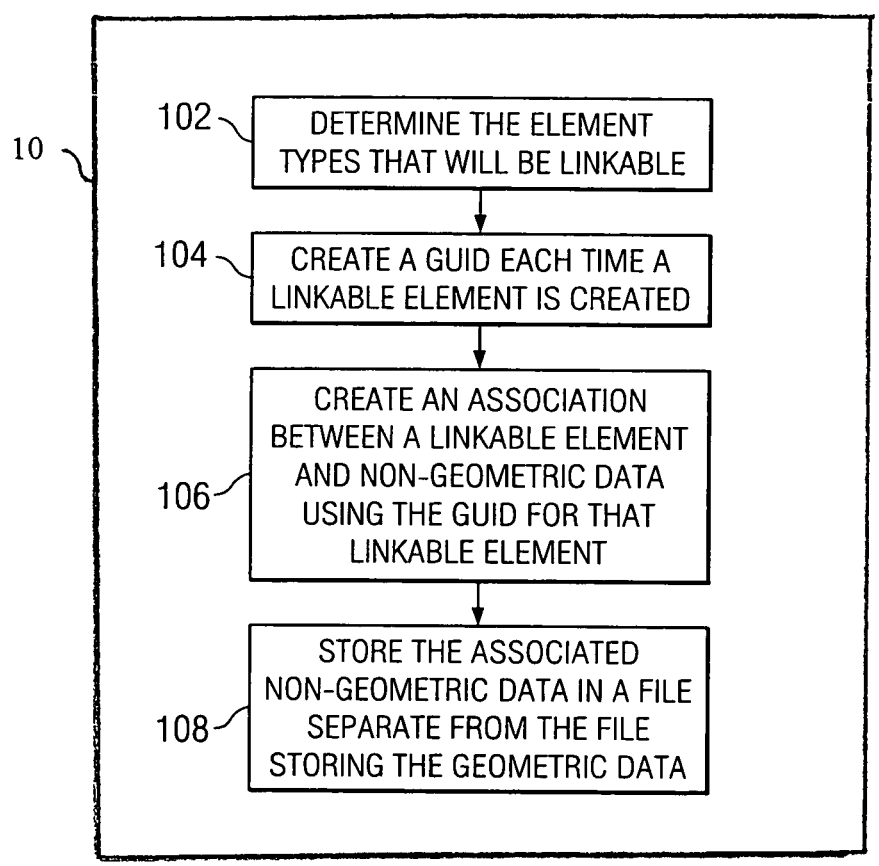

METHOD AND APPARATUS FOR LINKING NON-GEOMETRIC DATA TO GEOMETRIC ELEMENTS OF A CAD FILE INDEPENDENT OF THE PROPRIETARY CAD FILE FORMAT

FIELD OF THE INVENTION

The present invention relates generally to computer aided design (CAD) programs and more specifically to a method of linking non-geometric data to the geometric elements in a CAD file.

BACKGROUND OF THE INVENTION

Typically, during 3D CAD model design, the design process is mainly concerned with the creation of geometric product data (e.g. lines, faces and surfaces) of a component or assembly. The resulting CAD product data is generally complete in terms of its geometry (math data). The design process may also include non-geometric data, such as part cost, manufacture, etc. However the non-geometric CAD data is typically incomplete. There are several reasons for this: 1) Lack of Robustness—most CAD systems have some form of non-geometric data, but it usually takes the form of simple labels, dimensions, and notes. The non-geometric data lacks sufficient detail either about the assembly's or component's design/manufacturing specifications or design intent. It is relatively unorganized and has very limited querying and reporting mechanisms. 2) Lack of Granularity—most CAD systems only enable the designer to relate non-geometric data to a whole piece of geometry. For instance, non-geometric data can be related to a whole part, or the whole assembly, but not to an individual face or feature, of which there are 100's to 1,000's. 3) Lack of Exchange Standard—most CAD systems offer the capability of relating non-geometric data to their system's geometric data. However the format of the data is proprietary and during electronic exchanges or format translations much of the data is lost. This makes it very difficult to work with the non-geometric data associated with CAD product data outside the context of the original CAD system that generated the native data.

These issues limit the usefulness of the CAD product data for other downstream activities, for example, preparing bids or responding to quotes, tool design, engineering analysis, automated inspection, and documentation. It also makes supply chain partner activities almost impossible. To overcome these limitations the user must often contact multiple people within the supply chain multiple times to collect the non-geometric data they need in order to put the CAD product data into a form they can use. This process is usually time consuming and expensive. Considering that even a small product may contain tens of assemblies and hundreds of components supplied by tens of partners in a supply chain, this lack of completeness 'robs' the entire supply chain of tremendous profits in the form of increased costs and repeatedly delayed time-to-market.

Therefore there is a need for an information management system which, while independent of any CAD system, enables any user to add, edit, view, query and report on non-geometric data associated with any level of geometric data.

SUMMARY OF THE INVENTION

Methods and systems of linking non-geometric data to the geometric elements in a CAD file can improve the usefulness of the non-geometric data. The methods and systems are independent of any CAD system and allow the user to add, edit, view, query and report on non-geometric data associated with geometric data. The methods and systems support "content rich" non-geometric data and allow this data to be 'attached' to any level of the geometric CAD data. The methods and systems are easily accessible outside of a CAD system and leverage existing standards for Internet commerce.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 1 depicts a system performing a method according to an exemplary embodiment.

DETAILED DESCRIPTION OF THE PREFERRED EMBODIMENT

A method of linking non-geometric data to the geometric elements in a CAD file can improve the usefulness of the non-geometric data. An exemplary embodiment is independent of any CAD system and allows the user to add, edit, view, query and report on non-geometric data associated with the geometric data. The described embodiment supports "content rich" non-geometric data and allows this data to be "attached" to any level of the geometric CAD data. Embodiments may also provide a non-invasive, transparent, standards-based method for people to associate any kind of non-geometric data with CAD geometry independent of a CAD system.

CAD files are typically proprietary in nature and therefore only readable by the CAD software that created the file. There is an emerging standard for exchanging CAD information to other programs. The emerging standard is called "Standard for the exchange of Product data" (STEP). The STEP standard is being developed by the International Standard Organization (ISO) and has the ISO number 10303. The current version of ISO 10303 is version 00-02-08 and is hereby incorporated by reference. STEP has the ability to exchange digitally useful product information, for example design, analysis, manufacturing, and support information. Currently, however, it is used primarily as a translator and exchanger of geometric CAD product data.

Extensible markup language (XML) is a markup language for representing structured information in documents, typically web pages. XML is a restricted form of the Standard Generalized Markup Language (SGML) which corresponds to ISO 8879. The current version (1.0) of XML can be found at http://www.w3.org/TR/REC-xml and is hereby incorporated by reference. XML supports a myriad of data formats. These data formats include vector graphics, e-commerce transactions, common PC productivity file formats, mathematical equations, object meta-data, server APIs, and many other kinds of structured information. XML files can be read by the latest set of web browser software, for example Microsoft Explorer® version 5.0 and above. There are converters available that can transform or convert an XML file into a Hypertext Markup Language (HTML) file for use with older web browsers.

FIG. 1 discloses an embodiment in which CAD system 10 performs an exemplary method. Further, an embodiment providing a way of linking XML structured non-geometric data to geometrical elements (e.g., faces, edges or vertices) within a CAD file following the STEP standard will be described.

CAD drawings can contain a wide number of element types. Some of the element types occur in many CAD programs, and some elements are CAD program specific. The STEP standard includes most of the element types that occur in many CAD programs. Some of the standard element types include parts, edges, arcs, vertices, faces, and shells. Shells are typically a set of faces. Some element types are composed from smaller element types. For example parts and shells are both made up of smaller element types. The number of component elements that make up or compose a large element type is called the granularity of the element. The smallest granularity corresponds to an element that does not contain any other element.

Establishing links for non-geometric data for each and every element type in a CAD drawing may not be desirable in some applications for a number of reasons. One reason is the large number of element types that can exist in a CAD drawing. Another reason is that some element types may never need to have non-geometric data associated with the element type. One way to reduce the number of links is to limit the elements linked to some granularity level above the bottom level of granularity. Another way to limit the number of links is to only provide links for elements that are defined in the STEP standard. Elements that can be linked to non-geometric data will be called linkable element types (LET). Once the LETs have been determined (see 102 of FIG. 1), a unique identifier is created whenever a LET is created, as in 104. For example, when faces are one of the linkable element types, each time a face is created in the CAD software a unique identifier will also be created and associated with that particular face.

Unique identifiers are typically ASCII strings that have a hardware component and a time component. The hardware component is used to distinguish two unique identifiers that were created at the same time. The Windows® operating system has a system call that will create a unique identifier called a Global Unique Identifier (GUID).

To link a piece of non-geometric information to a LET element, an association between the non-geometric information and the LET element is created using the GUID (see 106 of the FIGURE).

The non-geometric information is typically stored in a separate file from the geometric data, as in 108. Each CAD drawing would now consist of two files, a proprietary file containing the geometric data and a file containing the non-geometric data stored preferably in a non-proprietary format, for example XML. This allows access to the non-geometric data by software that is unfamiliar with the file format of the CAD software. Some of the non-geometric data that could be linked to CAD elements include, but are not limited to: surface finish, tool used in fabrication, the name of the NC program used to create the part, the type of paint, the color of paint, the amount of paint used to coat the part, the part cost, and the name of the manufacturer. The two files can have the same name but with different extensions, for example part1.cad and part1.xml. This would help identify the non-geometric file that goes with the geometric file.

Appendix A is an example of a file comprising non-geometric data with a link to a CAD file. The file in appendix A contains the description of a part and a machine tool. The description of the machine tool starts at line 2 and ends at line 8. The description of the part starts at line 9 and ends at line 39. The GUID associated with the part is "B897E507-0FD5-11d4-9BAE-0060B0680315" (See line 9). The part has three faces and a FaceSet that references two of the face elements. The first reference to a face element starts on line 15 and ends on line 18. The first reference is to the face that starts on line 30 and ends on line 33 with the GUID of "B897E508-0FD5-11d4-9BAE-0060B0680315". The second reference to a second face element starts on line 19 and ends on line 22. Each face has its own GUID (see lines 30, 33 and 36). Associated with the face having the GUID of "B897E508-OFD5-11d4-9BAE-006080680315" is the material copper (See line 31). Each piece of non-geometric data will be associated with only one linkable element. A linkable element can have more than one piece of non-geometric data associated with it. For example the face with GUID number "B897E508-0FD5-11d4-9BAE-0060B0680315" can have a material (i.e. copper) associated with it and a cost associated with it.

Some embodiments may allow a manufacturing engineer to query the CAD drawings, using a web browser, to determine the material for the part, without having a copy of the CAD software that created the part. The manufacturing engineer may also add how much each part in a subassembly cost, without using the CAD software.

The foregoing description of the present invention has been presented for purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

APPENDIX A

```
<Assoc_Data>
  <Machining_Tools>
    <Drill guid="B897E50A-0FD5-11d4-9BAE-0060B0680315">
      <name>Drill 12</name>
      <Supplier>SmartDrill Inc.</Supplier>
      <Cost>5$</Cost>
    </Drill>
  </Machining_Tools>
  <Part guid="B897E507-0FD5-11d4-9BAE-006080680315">
    <Order_Number>A1234</Order_Number>
    <Storage_Location>Rack 5<Storage_Location>
    <MachiningAccuracy>1e-2 mm</MachiningAccuracy>
    <FaceSet guid="B897E509-0FD5-11d4-9BAE-0060B0680315"
name="Through Hole">
      <Reference>
        <type>Face</type>
        <target>B897E508-0FD5-11d4-9BAE-0060B0680315</target>
      </Reference>
      <Reference>
        <type>Face</type>
        <target>B897E50B-0FD5-11d4-9BAE-0060B0680315</target>
      </Reference>
      <Machining_Tool>
        <Reference>
          <type>Drill</type>
          <target>B897E50A-0FD5-11d4-9BAE-0060B0680315</target>
        </Reference>
      </Machining_Tool>
    </FaceSet>
    <Face guid="B897E508-0FD5-11d4-9BAE-0060B0680315">
      <Material>Copper</Material>
    </Face>
    <Face guid="B897E50B-0FD5-11d4-9BAE-0060B0680315">
      <Material>Brass</Material>
    </Face>
    <Face guid="B897E50C-0FD5-11d4-9BAE-0060B0680315">
      <Material>Steel</Material>
    </Face>
  </Part>
</Assoc_Data>
```

What is claimed is:

1. A method of linking non-geometric data to a geometric element, the geometric element having a geometric element type, in a computer aided design (CAD) drawing file, comprising:
   determining whether the geometric element type is a linkable element type selected from the group consisting of an edge, an arc, a vertex, a face, and a shell;
   creating a unique identifier for the geometric element to be linked only if the geometric element's geometric element type is in the group of linkable element types and refraining from creating the unique identifier for the geometric element to be linked if the geometric element's geometric element type is not in the group of linkable element types,
   associating the unique identifier with the non-geometric data if the geometric element's geometric element type is in the group of linkable element types, and
   storing the non-geometric data using a file type that is independent of a CAD program associated with the CAD drawing file.

2. The method of claim 1 further comprising:
   determining a geometric element type in a CAD drawing file to be linked.

3. The method of claim 2 further comprising:
   selecting the geometric element type from a plurality of granularity levels above a bottom granularity level.

4. The method of claim 2 further comprising:
   selecting the geometric element type from a group of elements defined in the Standard for Exchange of Product Data.

5. The method of claim 1 wherein the file type comprises Extensible Markup Language (XML).

6. The method of claim 1 wherein the unique identifier comprises an ASCII string.

7. The method of claim 1 further comprising:
   allowing a user to perform on the non-geometric data one or more of:
      adding;
      editing;
      viewing;
      querying; and
      reporting.

8. A computer aided design (CAD) system comprising:
   a memory storing:
      an element defined by the CAD system the element having an element type,
      a unique identifier associated with the element;
      non-geometric data; and
      a data file, accessible independently of the CAD system, comprising the non-geometric data wherein the non-geometric data is associated with the unique identifier to create a link between the element and the non-geometric data; and
   a processor configured to:
      determine whether the element type is a linkable element type selected from the group consisting of an edge, an arc, a vertex, a face, and a shell; and
      associate the unique identifier with the element only if the element's element type in the group of linkable element types and refraining from associating the unique identifier for the element if the element's element type is not in the group of linkable element types.

9. The CAD system of claim 8 wherein the element is a geometric element.

10. The CAD system of claim 8 wherein the unique identifier comprises a hardware component and a time component.

11. The CAD system of claim 8 wherein the non-geometric data comprises a representation of at least one or more of:
   a descriptive comment;
   a surface finish;
   a tool used in fabrication;
   a type of paint;
   a color of paint;
   an amount of paint used to coat a part;
   a cost of a part; and
   a name of a manufacturer.

12. The CAD system of claim 8 wherein the unique identifier is a Global Unique Identifier (GUID).

* * * * *